United States Patent
Nielsen et al.

(10) Patent No.: US 12,258,660 B2
(45) Date of Patent: Mar. 25, 2025

(54) VAPOR DEPOSITION APPARATUS AND METHOD

(71) Applicant: Raytheon Technologies Corporation, Farmington, CT (US)

(72) Inventors: Erik M. Nielsen, Middletown, NY (US); Peter F. Gero, Portland, CT (US)

(73) Assignee: RTX Corporation, Farmington, CT (US)

( * ) Notice: Subject to any disclaimer, the term of this patent is extended or adjusted under 35 U.S.C. 154(b) by 442 days.

(21) Appl. No.: 17/176,436

(22) Filed: Feb. 16, 2021

(65) Prior Publication Data

US 2021/0172052 A1 Jun. 10, 2021

Related U.S. Application Data

(63) Continuation of application No. 15/202,984, filed on Jul. 6, 2016, now abandoned.

(51) Int. Cl.
*C23C 14/26* (2006.01)
*C23C 14/24* (2006.01)

(52) U.S. Cl.
CPC ............ *C23C 14/26* (2013.01); *C23C 14/24* (2013.01); *C23C 14/243* (2013.01); *C23C 14/246* (2013.01)

(58) Field of Classification Search
CPC .............................................. C23C 14/24–325
See application file for complete search history.

(56) References Cited

U.S. PATENT DOCUMENTS

| | | |
|---|---|---|
| 3,730,962 A | 5/1973 | Norwalk |
| 4,464,222 A | 8/1984 | Gutsche |
| 5,389,152 A | 2/1995 | Thurston et al. |
| 5,418,003 A | 5/1995 | Bruce et al. |
| 5,516,367 A | 5/1996 | Lei et al. |
| 5,532,102 A | 7/1996 | Soden et al. |
| 6,179,924 B1 | 1/2001 | Zhao et al. |
| 6,350,320 B1 | 2/2002 | Sherstinsky et al. |
| 6,494,955 B1 | 12/2002 | Lei et al. |
| 6,589,351 B1 | 7/2003 | Bruce et al. |
| 2005/0034671 A1 | 2/2005 | Ohara |
| 2005/0109276 A1 | 5/2005 | Iyer et al. |
| 2005/0193952 A1 | 9/2005 | Goodman et al. |
| 2005/0229856 A1 | 10/2005 | Malik |
| 2006/0169211 A1 | 8/2006 | Kim et al. |

(Continued)

FOREIGN PATENT DOCUMENTS

GB 2361051 10/2001

OTHER PUBLICATIONS

See "contain," Merrian-Webster.com (accessed Oct. 2, 2024), https://www.merriam-webster.com/dictionary/contain.*

(Continued)

*Primary Examiner* — Aiden Lee
(74) *Attorney, Agent, or Firm* — Carlson, Gaskey & Olds, P.C.

(57) ABSTRACT

A vapor deposition apparatus includes a chamber configured to operate at vacuum and at least one crucible in the chamber. The crucible is configured to receive an ingot, a feeder operable to move the ingot with respect to the at least one crucible, and a heater in the chamber and configured to heat a hot zone between the at least one crucible and the feeder. A method for vapor deposition is also disclosed.

8 Claims, 3 Drawing Sheets

(56) References Cited

U.S. PATENT DOCUMENTS

2007/0141233 A1 6/2007 Schlichting
2009/0325367 A1 12/2009 He et al.
2010/0247747 A1 9/2010 Yamazaki

OTHER PUBLICATIONS

European Search Report for EP Application No. 17179810.1 dated Nov. 21, 2017.

* cited by examiner

VAPOR DEPOSITION APPARATUS AND METHOD

CROSS REFERENCE TO RELATED APPLICATION

This application is a continuation of U.S. application Ser. No. 15/202,984 filed Jul. 6, 2016.

BACKGROUND

Certain ceramic processing occurs under vacuum, such as physical vapor deposition (PVD) or directed vapor deposition (DVD). Source material is typically fed into a crucible, which is held at vacuum inside a processing chamber. This source material can be a ceramic ingot.

SUMMARY

A vapor deposition apparatus according to an example of the present disclosure includes a chamber configured to operate at vacuum and at least one crucible in the chamber. The crucible is configured to receive an ingot, a feeder operable to move the ingot with respect to the at least one crucible, and a heater in the chamber and configured to heat a hot zone between the at least one crucible and the feeder.

In a further embodiment of any of the foregoing embodiments, the feeder includes a drive mechanism and a mechanical guide mechanism or guide rods.

In a further embodiment of any of the foregoing embodiments, the heater is between the mechanical guide mechanism or guide rods and the crucible.

In a further embodiment of any of the foregoing embodiments, the heater is fixed to the crucible.

In a further embodiment of any of the foregoing embodiments, the heater is an induction heater.

In a further embodiment of any of the foregoing embodiments, the heater is a microwave heater.

In a further embodiment of any of the foregoing embodiments, the heater is a resistance heater.

In a further embodiment of any of the foregoing embodiments, the heater is selected from a group consisting of an induction heater, a microwave heater, and a resistance heater.

In a further embodiment of any of the foregoing embodiments, the heater circumscribes the hot zone.

In a further embodiment of any of the foregoing embodiments, the heater is operable to heat the hot zone above the vaporization temperature of water across a typical range of thermal emission physical vapor deposition (TE-PVD) process pressures.

A further embodiment of any of the foregoing embodiments includes heat shields defining the hot zone.

A method for vapor deposition according to an example of the present disclosure includes driving off moisture from an ingot in a vapor deposition chamber prior to the ingot entering a crucible, and providing the ingot to the crucible for vapor deposition.

A further embodiment of any of the foregoing embodiments includes feeding the ingot through a hot zone and into the crucible.

In a further embodiment of any of the foregoing embodiments, the hot zone is defined between an ingot feeder and the crucible.

In a further embodiment of any of the foregoing embodiments, the moisture is driven off as the ingot is fed through the hot zone.

In a further embodiment of any of the foregoing embodiments, heat is retained by providing heat shields.

A further embodiment of any of the foregoing embodiments includes heating the hot zone with a heater that is in the chamber.

In a further embodiment of any of the foregoing embodiments, the heater is selected from a group consisting of an induction heater, a microwave heater, and a resistance heater.

In a further embodiment of any of the foregoing embodiments, the ingot is heated to a temperature above the vaporization temperature of water.

In a further embodiment of any of the foregoing embodiments, the heater circumscribes the ingot.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Thermal emission physical vapor deposition processes (TE-PVD), such as electron beam physical vapor deposition (EB-PVD) and electron beam directed vapor deposition (EB-DVD), are used to deposit coatings. Such processes can be used to deposit ceramic coatings, for example. In vapor deposition processes, an energy source such an electron gun heats, melts, and vaporizes a source ingot, such as a ceramic material. The vapor condenses and deposits on an article in a vapor field, usually above the ingot. In an EB-DVD process, a gas stream (either inert or reactive) can be used to enhance transport of the vapor towards the article. Such processes are typically performed under vacuum and at high heat.

Figure 1A:
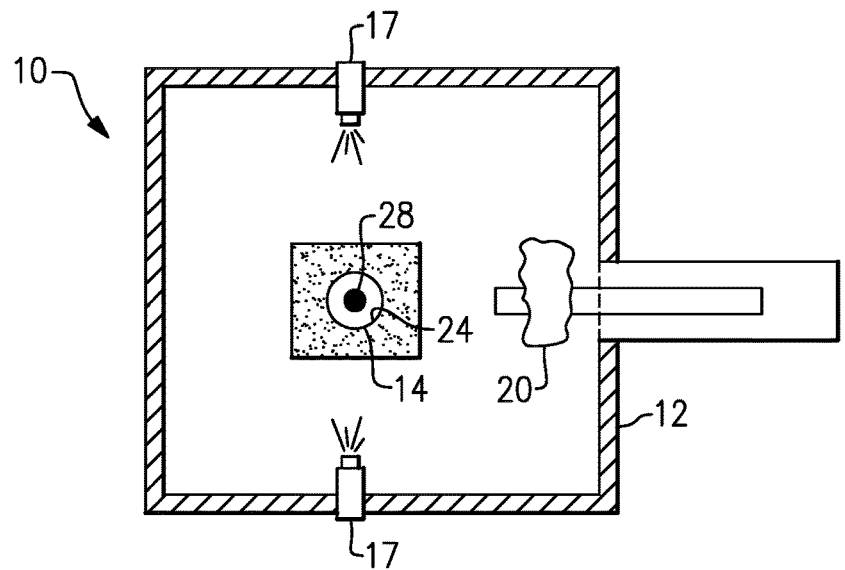
FIG. 1A illustrates a process chamber.
Figure 1B:
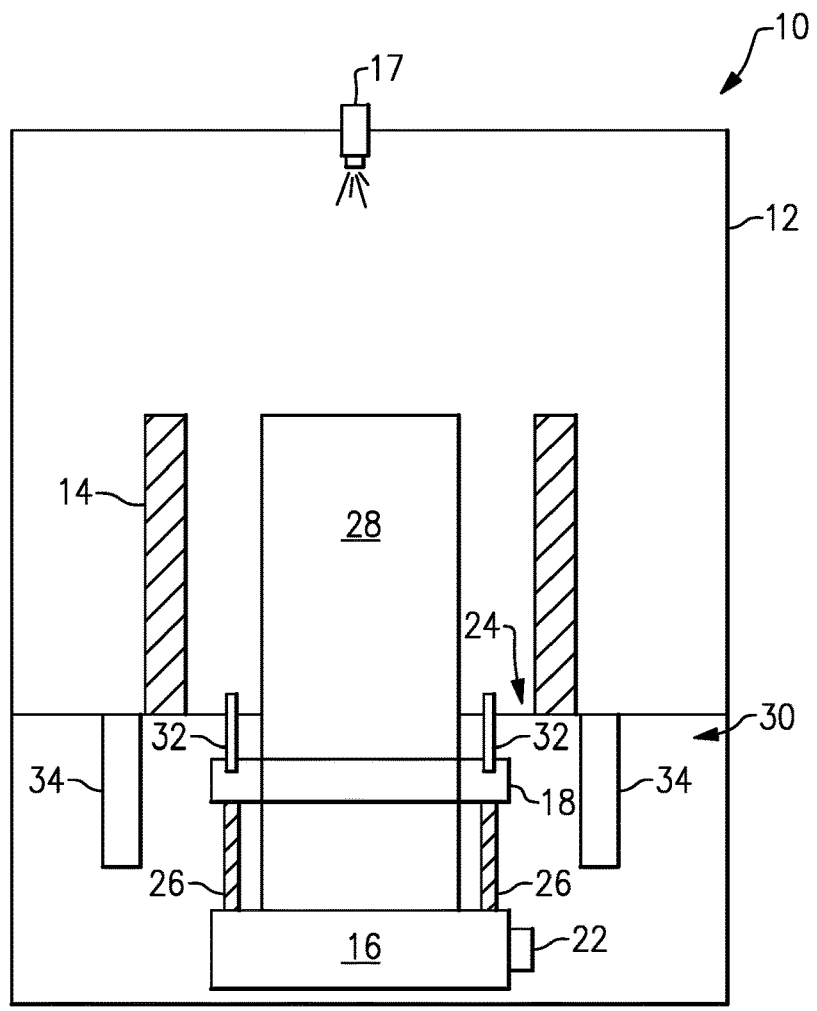
FIG. 1B illustrates a side view of a process chamber.

FIGS. 1A-1B illustrate a vapor deposition apparatus 10. The vapor deposition apparatus 10 includes a process chamber 12 that is configured to operate at vacuum and at high temperatures. For example, the process chamber 12 can be connected in a known manner to gas sources and a vacuum pump system, etc., not described herein. The process chamber 12 includes at least once crucible 14, a feeder 16, and a heater 18 between the crucible 14 and the feeder 16. In this example, the process chamber 12 includes a single crucible 14. However, it should be understood that the process chamber 12 may include multiple crucibles 14. The process chamber 12 also includes at least one energy source 17. In this example, the energy source 17 is an electron gun. Inside the process chamber 12 is an article 20 to which a coating is to be applied by a vapor deposition process. In one example, the article 20 is a component for a gas turbine engine, such as an airfoil.

The feeder 16 has a drive mechanism 22 that provides the ingot material 28, such as ceramic, to the crucible 14 via an aperture 24. The feeder 16 also has a mechanical guide mechanism or guide-rods 26 to guide the ingot 28 into the aperture 24. The ingot 28 can be provided in the form of a cylinder, but is not limited to such a geometry. The feeder 16 advances the ingot 28 into the crucible 14 at a predetermined rate. In one example, the rate is 2 mm per minute (0.08 inches per minute). The energy source 17 melts and vaporizes the top of the ingot 28 as it is delivered into the crucible 14.

Situated between the crucible 14 and the feeder 16 is a hot zone 30. The heater 18 is operable to heat the hot zone 30 across a typical range of TE-PVD process pressures. In this example, the heater 18 is fixed to the crucible 14 by fasteners 32 and is arranged on top of the guide mechanical guide mechanism or rods 26. In some process chambers 12, the crucible 14 may move throughout the vapor deposition process. In this example, the heater 18 would move with the crucible 14.

The ingot 28 passes adjacent the heater 18 as it advances through the hot zone 30 and the aperture 24 into the crucible 14. If the process chamber 12 includes multiple crucibles 14, each crucible 14 has a heater 18 fixed to it. Because the heater 18 is adjacent the crucible 14 and is inside the process chamber 12, there is no need for the ingot 28 to be separately heated outside the process chamber 12, and then inserted into the process chamber 12, minimizing the risk of burns or other injury to the operator.

In one example, the heater 18 heats the ingot 28 such that substantially all of the water in the ingot 28 is evaporated off. In one example, the heater 18 heats the ingot 28 to a temperature of above about 350° F. (177° C.). In a further example, the heater 18 heats the ingot 28 to a temperature between about 350° F. (177° C.) and 400° F. (204° C.).

The heater 18 transfers heat to a 'moist' ingot 28, which causes any water in the ingot 28 to evaporate. Ingot 28 drying can occur at ambient pressure, or at vacuum while a vacuum is being applied to the process chamber 12. Shields 34, such as lightweight metal or composite shields, can be used to surround the hot zone and concentrate heat on the ingot 28.

Figure 2:
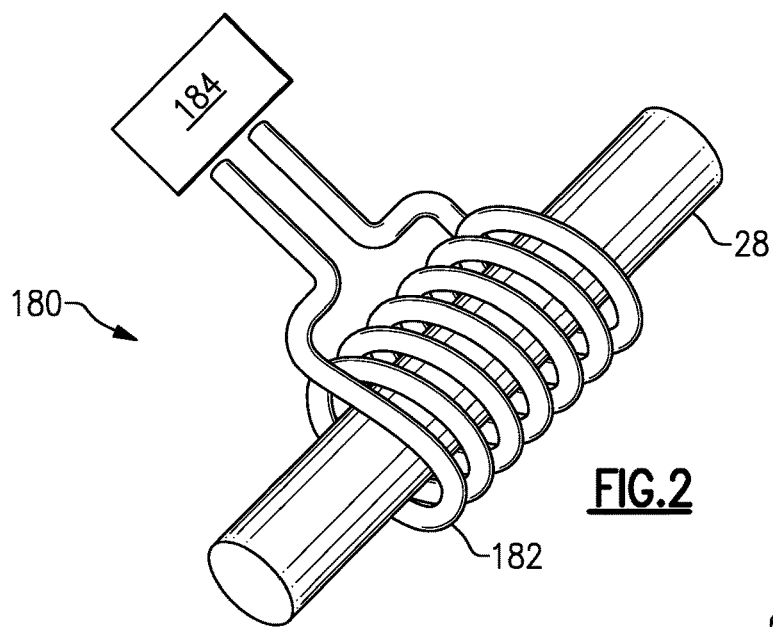
FIG. 2 illustrates an induction heater for the process chamber of FIG. 1.

In one example, shown in FIG. 2, the heater 18 is an induction heater 180. The induction heater 180 includes a coil 182, such as a water-cooled high-frequency coil, that circumscribes the ingot 28. The coil 182 can have a frequency that corresponds to the density and shape of the ingot 28. The induction heater 180 also includes a power source 184. An induction heater 180 allows for very concentrated and quick heating of the ingot 28.

Figure 3:
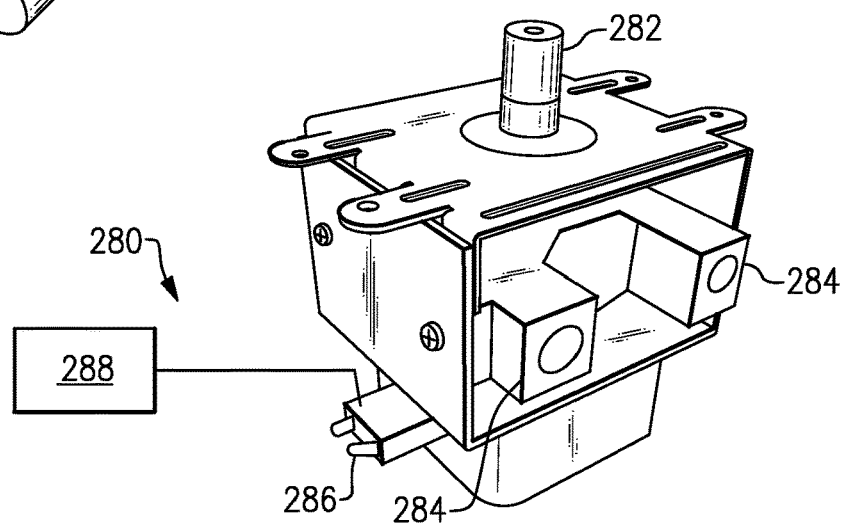
FIG. 3 illustrates an example microwave heater for the process chamber of FIG. 1.

In another example, shown in FIG. 3, the heater 18 is a microwave heater 280. The microwave heater 280 includes a microwave output antenna 282, water line connections 284 for providing cooling water to the heater 280, a power input 286, and a power source 288. Microwave energy from the antenna 282 is absorbed by water in the ingot 28 as it passes by the microwave heater 280. This process is called dielectric heating.

Figure 4:
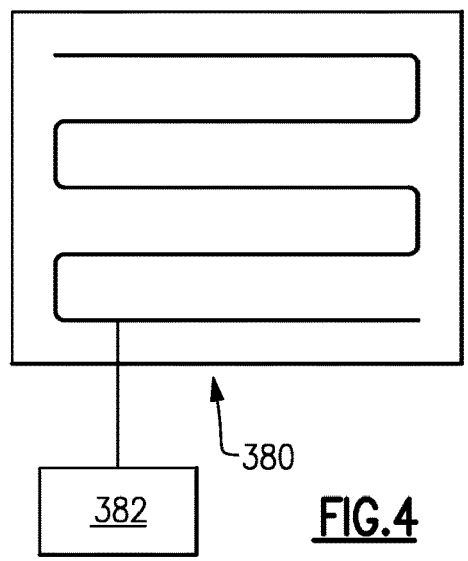
FIG. 4 illustrates a resistance heater for the process chamber of FIG. 1.

In a third example, shown in FIG. 4, the heater 18 is a resistance heater 380 connected to a power source 382.

Because the ingot 28 is substantially freed of water as it travels through the hot zone 30 before entering the crucible 14, the risks of cracking or fracture, delayed drying, process contamination, 'spitting' of molten ceramic, or the like, are reduced.

Figure 5:
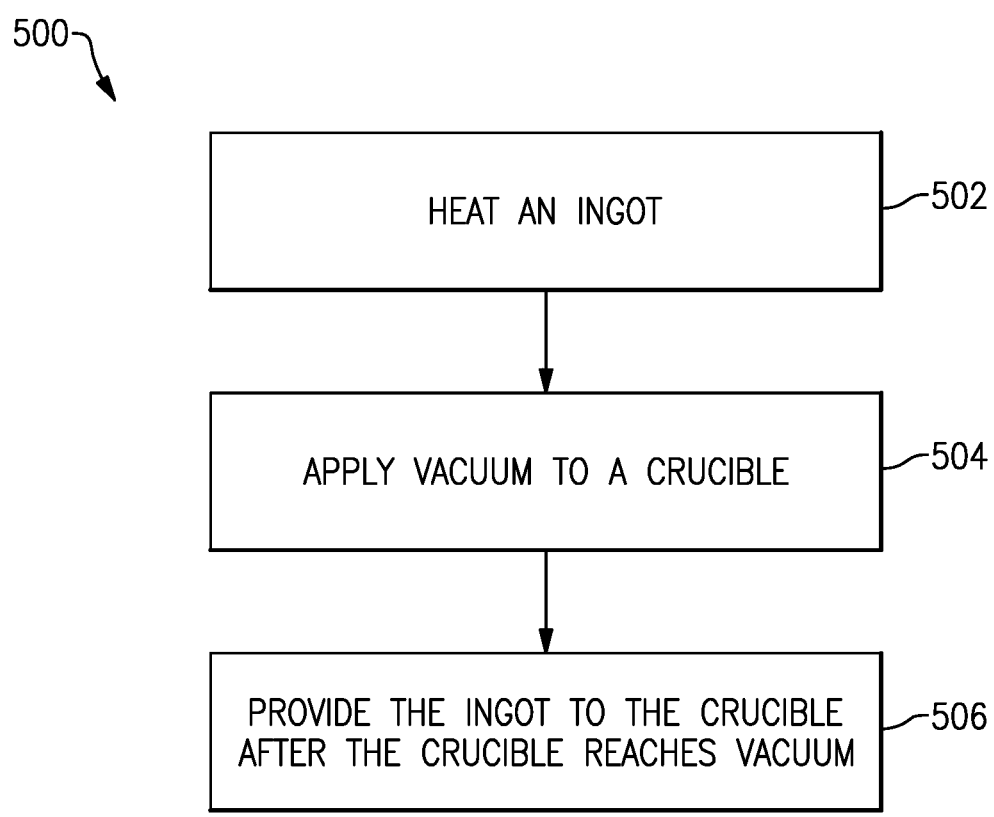
FIG. 5 illustrates a vapor deposition method.

FIG. 5 shows a method for vapor deposition 500. In step 502, an ingot 28 is heated. In step 504, vacuum is applied to a crucible 14. In step 506, the ingot 28 is provided to the crucible 14 after the crucible 14 reaches vacuum.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from this disclosure. The scope of legal protection given to this disclosure can only be determined by studying the following claims.

What is claimed is:

1. A vapor deposition apparatus, comprising:
   a chamber configured to operate at vacuum;
   a crucible in the chamber, the crucible configured to receive an ingot;
   a feeder operable to move the ingot with respect to the crucible; and
   a heater in the chamber, the heater contained between the crucible and the feeder, and configured to heat a hot zone between the crucible and the feeder.

2. The apparatus of claim 1, wherein the heater is selected from a group consisting of an induction heater, a microwave heater, and a resistance heater.

3. The apparatus of claim 1, wherein the heater circumscribes the hot zone.

4. The apparatus of claim 1, wherein the heater is operable to heat the hot zone above the vaporization temperature of water across a range of thermal emission physical vapor deposition (TE-PVD) process pressures.

5. The apparatus of claim 1, further comprising heat shields defining the hot zone.

6. The apparatus of claim 1, wherein the feeder is arranged beneath the crucible, and wherein the heater is fixed to an underside of the crucible by fasteners.

7. The apparatus of claim 6, wherein the heater is arranged on top of guide rods extending from the feeder.

8. The apparatus of claim 7, wherein the heater is contained between the guide rods and the crucible.

\* \* \* \* \*